Jan. 6, 1953 B. D. LOUGHLIN 2,624,837

TUNING INDICATOR SYSTEM

Filed May 28, 1949

*INVENTOR.*
BERNARD D. LOUGHLIN
*BY* Laurence B. Dodds
ATTORNEY

Patented Jan. 6, 1953 2,624,837

UNITED STATES PATENT OFFICE 2,624,837

TUNING INDICATOR SYSTEM

Bernard D. Loughlin, Lynbrook, N. Y., assignor to Hazeltine Research, Inc., Chicago, Ill., a corporation of Illinois Application May 28, 1949, Serial No. 96,099

7 Claims. (Cl. 250—20)

Figure 1:
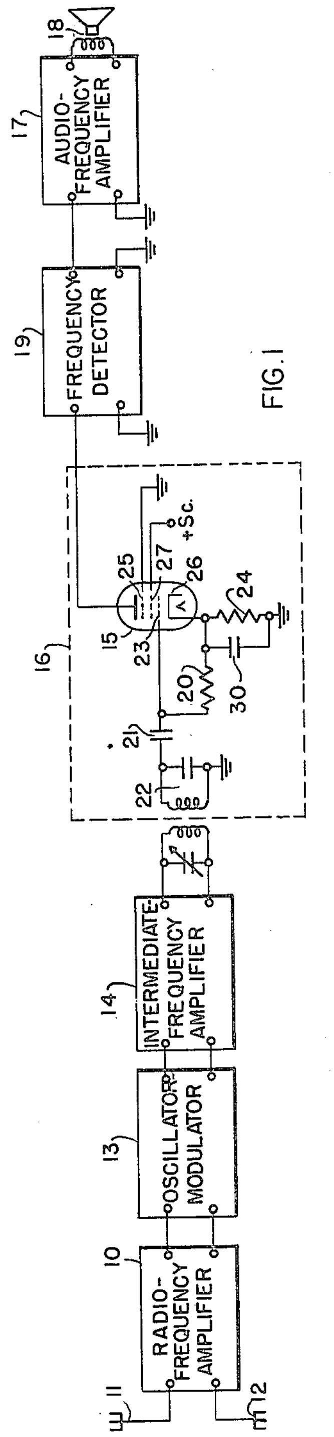

The present invention relates to tuning indicator systems for tunable frequency-modulation wave-signal receivers, and, more particularly, to novel tuning indicator systems which permit accurate tuning of such receivers by sensing the output sound volume, as by listening thereto, in much the same manner as in a conventional amplitude-modulation receiver.

Wave-signal receivers conventionally are provided with an adjustable tuning means for tuning the receiver to a desired carrier signal. Tuning indicator means are provided in such receivers for determining the correctness of tuning of the receiver. The indication of these tuning indicators may comprise the simple audible indication of the audio-frequency modulation signal applied to the loudspeaker of the radio receiver or may comprise a visual indication afforded by a cathode-ray-eye type of tuning indicator.

Tuning indicators for amplitude-modulation wave-signal receivers usually indicate the magnitude of a unidirectional current or voltage derived from, and varying with, the average amplitude of the wave signal translated by the receiver which, in turn, varies in accordance with the accuracy of tuning of the receiver to the received signal. The average amplitude of the wave-signal translated by the receiver in general is greatest when the receiver is accurately tuned, and the operation of such tuning devices is premised upon this fact. Audible tuning of this type is generally rather quick, easy and accurate enough for use with inexpensive receivers and is, on the whole, an acceptable type of tuning to many radio users.

On the other hand, the tuned circuits of a frequency-modulation receiver generally have a fairly uniform response over a broad frequency band. It is consequently difficult to ascertain, within a reasonable degree of accuracy, the condition of tuning of such receivers where the tuning indicator is responsive to the amplitude of the signal energy appearing in the signal channel of the receiver, especially when such indication is audibly determined. Tuning indicators for frequency-modulation receivers thus are usually arranged to be responsive to a tuning control potential derived from the output circuit of the frequency detector of the receiver. This potential has a magnitude and polarity varying in accordance with the degree and direction, respectively, of mistuning of the receiver on either side of the mean frequency of a desired received wave signal and the indicators are usually of the visible indication type.

Experience has shown that many persons prefer to tune a wave-signal receiver by sensing the reproduced sound intensity, for example by listening for maximum signal volume. For this reason those who tune the receivers by ear are prone to ignore any visual tuning indicator provided in such receivers even though tuning by ear, especially in the case of available frequency-modulation wave-signal receivers, cannot usually be relied upon. It is desirable, therefore, to provide a simple and inexpensive yet effective tuning indicator system which will facilitate accurate tuning of a frequency-modulation receiver simply by sensing the reproduced sound volume, as is now done with amplitude-modulated types of receivers.

It is an object of the present invention, therefore, to provide a new and improved tuning indicator system for a tunable frequency-modulation carrier-signal receiver which avoids one or more of the disadvantages and limitations of prior systems of this nature.

It is a further object of the invention to provide a novel and inexpensive tuning indicator system for a tunable frequency-modulation carrier-signal receiver which enables the receiver to be tuned by ear in a manner similar to that of an amplitude-modulation receiver.

In accordance with the invention, a tuning indicator system for a tunable frequency-modulation carrier-signal receiver comprises a carrier-signal limiting means including an electron-discharge device having a plurality of electrodes, one pair thereof being coupled in a circuit proportioned to develop a predetermined relatively fixed amplitude-limiting level, and another pair of the aforementioned electrodes electron-coupled to the above-mentioned circuit, one of said other pair of said electrodes being so arranged as to develop in the vicinity of said one electrode a virtual cathode which is effective in combination with said other pair of said electrodes to control the transconductance of the aforementioned device subsequent to limiting so that in the output circuit of the limiting means the limiting level appears to vary in value with the transconductance though said level actually remains relatively fixed. The system also includes means for deriving, at least at the point of the limiting means in the system, a control effect varying with the average intensity of the carrier signal applied to the limiting means, and means responsive to the control effect for controlling the transconductance of the limiting means to vary the transconductance thereof in accordance with the carrier-signal intensity, whereby the receiver may be accurately tuned to a desired carrier signal by observation of a characteristic of the signal translated by the limiting means.

For a better understanding of the present invention, together with other and further objects thereof, reference is had to the following description taken in connection with the accompanying drawing, and its scope will be pointed out in the appended claims.

The tuning indicator system of the present invention is related to the system of applicant's copending application entitled "Tuning Indicator System," Serial No. 96,098, filed concurrently herewith, and assigned to the same assignee as the present invention. The latter system comprises a signal-translating channel having an input circuit to which a frequency-modulated wave signal is applied, and means within this channel for limiting the amplitude of the wave signal translated thereby to a predetermined amplitude level. The system also includes a control system which is responsive to the average amplitude of the wave signal translated by the above-mentioned channel to a point therein preceding the limiting means for controlling the transconductance of the channel at a point therein subsequent to the point at which effective limiting of the wave signal is effected.

The tuning indicator system of the present invention is also related to the system of applicant's copending application entitled "Tuning Indicator System," Serial No. 96,100, filed concurrently herewith, and assigned to the same assignee as the present invention. The latter system includes a controllable transconductance signal-translating channel coupled to the signal output circuit of a frequency detector and a control system which derives the unidirectional component of the detector output signal and utilizes this component so to control the translating channel as to decrease the transconductance thereof gradually with the departure of the unidirectional component from a predetermined value.

Figure 3:
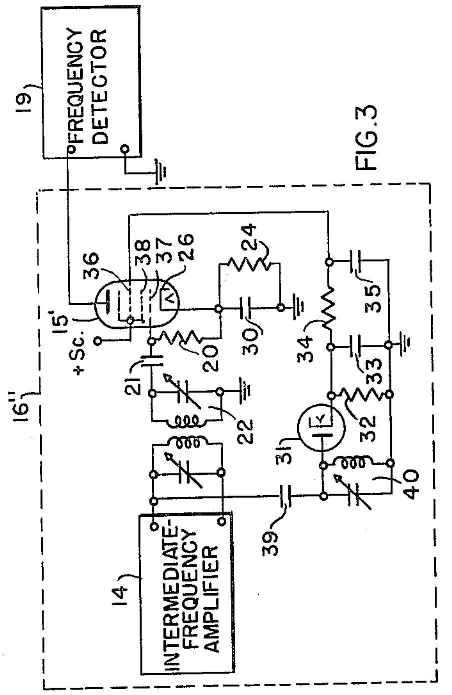
Figure 2:
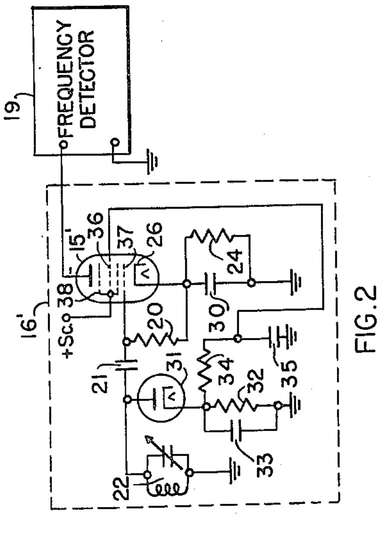

In the drawing, Fig. 1 is a circuit diagram, partly schematic, representing a complete tunable frequency-modulation carrier-signal receiver which includes a tuning indicator system embodying the present invention; and Figs. 2 and 3 are circuit diagrams of portions only of a complete receiver and represent tuning indicator systems embodying the invention in modified forms.

Referring now more particularly to Fig. 1 of the drawing, the receiver includes a radio-frequency amplifier 10 having an input circuit coupled to an antenna system 11, 12 and having an output circuit coupled to an oscillator-modulator 13. Coupled in cascade with the oscillator-modulator 13, in the order named, are an intermediate-frequency amplifier 14 of one or more stages, a tuning indictor system 16 more fully to be described hereinafter, a frequency-modulation detector 19, an audio-frequency amplifier 17 of one or more stages, and a sound-reproducing device 18.

Considering the operation of the receiver as a whole, but neglecting for the moment the detailed operation of the tuning indicator system 16 presently to be described, a desired received frequency-modulated signal intercepted by antenna system 11, 12 is selected and amplified by the radio-frequency amplifier 10, is converted into a frequency-modulated intermediate-frequency signal in the oscillator-modulator 13, is further amplified and selected by intermediate-frequency amplifier 14, limited in amplitude by a limiter included in unit 16, and applied to the frequency-modulation detector 19 to derive the audio frequency-modulation components. The audio-frequency components are in turn amplified by the audio-frequency amplifier 17 and are reproduced by the sound reproducer 18 in a conventional manner.

Referring now more particularly to the portion of the receiver embodying the present invention, the tuning indicator system 16 comprises carrier-signal amplitude-limiting means including a vacuum-tube repeater 15 having a first portion so proportioned as to develop a predetermined relatively fixed amplitude-limiting level and having a second portion effectively independent of the first portion and so arranged as to have a controllable transconductance characteristic subsequent to limiting so that in the output circuit of the limiting means the limiting level appears to vary in value with the transconductance though the level actually remains relatively fixed.

It is seen that the tube 15 includes at least an anode, a cathode 26 and a plurality of electrodes intermediate the anode and cathode, in particular a screen electrode 27, a suppressor electrode 25 and a control electrode 23. The cathode 26 and one of the intermediate electrodes, that is the control electrode 23, are coupled in a circuit proportioned to develop the predetermined limiting level discussed above. The anode and another of the intermediate electrodes, in particular the suppressor electrode 25, are electron-coupled to the circuit including the cathode 26. The other intermediate electrode, the suppressor electrode 25, is so arranged as to develop near this electrode a virtual cathode which is effective in combination with the electrode 25 and the anode to control the transconductance of the tube as described above.

In particular, the tube 15 includes means for deriving at least at the point of the limiting means in the system a control effect varying with the average intensity of a carrier signal applied to the limiting means. This means includes a control electrode 23 which is coupled through a coupling condenser 21 to an intermediate-frequency resonant circuit 22 and includes a cathode 26 which is coupled through a grid-leak resistor 29 to the control electrode 23. The cathode 26 of the tube 15 is also coupled to ground through a cathode resistor 24 having coupled in shunt thereto a condenser 30.

The repeater tube 15 also includes means responsive to the control effect derived from the circuit including electrodes 23 and 26 for controlling the gain of the limiting means to vary the gain thereof in accordance with the carrier-signal intensity. This means comprises a screen grid 27 which is energized from a source, indicated as +Sc, and a suppressor electrode 25 connected to ground.

In considering the operation of the tuning indicator system just described, it will be assumed that the receiver is initially tuned well to one side of a desired wave signal and is then slowly tuned toward the signal. At the initiation of the tuning operation, only a relatively weak intensity wave signal is received and applied from the intermediate-frequency amplifier 14 to the unit 16. Since under this condition the control electrode 23 has the same potential as the cathode 26, the tube 15 is fully conductive to develop a relatively large unidirectional potential across the cathode resistor 24. This potential appears with negative polarity on the suppressor electrode 25 of the tube 15 thus substantially to reduce the transconductance of this tube. As the receiver is tuned progressively closer to the mean frequency of the wave signal, the intensity of the intermediate-frequency signal applied from the amplifier 14 to the unit 16 becomes progressively larger and eventually causes the control electrode 23 of the tube 15 to become positive on the positive peaks of each cycle of the signal. Current flowing between the control electrode 23 and cathode 26 charges the condenser 21 and develops a negative potential across the resistor 20. This in turn reduces the average current flowing in the tube 15 and correspondingly reduces the magnitude of the unidirectional potential developed across the cathode resistor 24 and applied with negative polarity to the suppressor electrode 25. The transconductance of the tube 15 is thereby increased. The action of the control electrode 23 in charging the condenser 21 effects stabilization of the positive peaks of the intermediate-frequency signal at the zero bias potential region of the control electrode in a manner well understood in the art. Therefore, further increases in amplitude of this signal reduce the angle of anode-current flow in each cycle of the signal and the resultant reduction of average anode current effects a corresponding reduction of the potential developed across the cathode resistor 24. The tube 15 thus has a value of transconductance which progressively increases with the intensity of the intermediate-frequency signal applied to the unit 16 for all values thereof larger than that at which the control electrode 23 of the tube 15 becomes positive.

It will be apparent that the largest amplitude signal is developed in the output circuit of the tube 15 when the receiver is accurately tuned to the received wave signal. Continued tuning of the receiver beyond the mean frequency of the received wave signal results in decreasing intensities of the signal applied to unit 16 with consequent reduction of the bias potential developed across the resistor 20. This, of course, causes the tube 15 to become more fully conductive and to develop a potential of larger magnitude across the cathode resistor 24 with the result that the transconductance of the amplifier tube 15 is correspondingly decreased. The operation of the unit 16, consequently, is such as to cause the intermediate-frequency signal developed in the output circuit of this unit and applied to the frequency detector 19 to have an average amplitude which varies almost directly with the intensity of the intermediate-frequency signal applied to the unit 16. The volume of the sound reproduced by the loudspeaker 18 correspondingly varies in magnitude, and has the largest value when the receiver is accurately tuned to the mean frequency of the wave signal. It will be apparent, therefore, that the receiver may be accurately tuned by sensing the volume of the reproduced sound much as in the tuning of an amplitude-modulation receiver.

The present tuning indicator system also effects limiting of the amplitude of the intermediate-frequency signal which it translates to the frequency detector 19. Its operation in this regard is much like that of a conventional grid bias limiter except that the output signal of the latter remains substantially constant over a wide range of amplitudes of the applied signal. The output signal of the present system has a constant amplitude for a given intensity of the applied intermediate-frequency signal but the average amplitude varies with the intensity of the applied signal for reasons above explained.

Fig. 2 is a circuit diagram representing a modified form of the invention which is essentially similar to the arrangement of Fig. 1, similar elements being designated by similar reference numerals and analogous elements by similar reference numerals primed. In the modified arrangement, a diode rectifier device 31 is coupled in series with its load resistor 32 across the tuned input circuit 22 of the unit 16'. A condenser 33 is connected in parallel with the load resistor 32, and the unidirectional potential developed across the elements 32 and 33 is applied through a modulation-signal filter, comprising a series resistor 34 and a shunt condenser 35, to a control electrode 36 of a repeater vacuum tube 15'. The latter includes a control electrode 37 which is coupled through the condenser 21 to the tuned input circuit 22 and includes a screen electrode 38 which shields the control electrode 36 both from the control electrode 37 and the anode of the tube 15'. The operation of this modified form of indicator system is essentially similar to that of Fig. 1 except that the diode rectifier 31 develops a positive polarity bias potential across its load resistor 32 and this potential is applied to the control electrode 36 of the tube 15' to increase the transconductance thereof with increasing average intensities of the applied intermediate-frequency signal. The output signal of unit 16' thus has an amplitude which is limited to a substantially constant value for any given value of amplitude of the applied intermediate-frequency signal but yet has an average amplitude which varies with the intensity of the applied signal.

The modified form of the invention represented by the circuit diagram of Fig. 3 is essentially similar to the arrangement of Fig. 2, similar elements being represented by similar reference numerals and analogous elements by similar reference numerals double primed. The diode rectifier 31 is coupled to the intermediate-frequency signal-translating channel of the receiver through a condenser 39 and a resonant circuit 40 which is tuned to the mean frequency of the intermediate-frequency channel. Circuit 40 is a very high Q circuit, Q having the usual definition as the ratio of reactance to resistance, and is only lightly coupled by the condenser 39 to the intermediate-frequency channel 14 in order that the resonant circuit shall have high selectivity. It will be apparent, therefore, that the unidirectional potential developed by the rectifier device 31 and applied to the control electrode 36 of the tube 15' varies rapidly with the frequency of the applied intermediate-frequency signal on either side of the resonant frequency of the tuned circuit 40, thus rapidly to vary the transconductance of the tube 15' with relation to the intermediate frequency of the signal-translating channel. The operation of this modified form of the invention is otherwise essentially similar to that of Fig. 2.

While applicant does not intend to be limited thereto, the following values of circuit components have been found suitable for the modification of the invention represented by Fig. 2:

| | |
|---|---|
| Tube 15' | Type 6SA7. |
| Rectifier device 31 | Type 6H6. |
| Resistor 20 | 100,000 ohms. |
| Resistor 24 | 2,200 ohms. |
| Resistor 32 | 470,000 ohms. |
| Resistor 34 | 1,000,000 ohms. |
| Condenser 21 | 100 micromicrofarads. |
| Condenser 30 | .01 microfarad. |
| Condenser 33 | 50 micromicrofarads. |
| Condenser 35 | 0.1 microfarad. |
| Value of potential applied to the anode of tube 15'. | 250 volts |
| Value of potential applied to the screen electrode 38 of tube 15'. | 70 volts |

It will be apparent from the above description of the invention that a frequency-modulation wave-signal receiver embodying the invention may be readily and accurately tuned by sensing the reproduced sound volume much as in the tuning of a conventional amplitude-modulation receiver, thereby to dispense with the need of any form of visual tuning indicator. The tuning indicator system of the present invention has the additional advantage that it involves an exceptionally simple circuit arrangement requiring very few circuit components in addition to those normally provided in a conventional frequency-modulation receiver.

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A tuning indicator system for a tunable frequency-modulation carrier-signal receiver comprising: carrier-signal limiting means including an electron-discharge device having a plurality of electrodes one pair thereof being coupled in a circuit proportioned to develop a predetermined relatively fixed amplitude-limiting level, and another pair of said electrodes electron-coupled to said circuit, one of said other pair of said electrodes being so arranged as to develop in the vicinity of said one electrode a virtual cathode which in combination with said other pair of said electrodes is effective to control the transconductance of said device subsequent to limiting so that in the output circuit of said limiting means said limiting level appears to vary in value with said transconductance though said level actually remains relatively fixed; means for deriving at least at the point of said limiting means in said system a control effect varying with the average intensity of a carrier signal applied to said limiting means; and means responsive to said control effect for controlling the transconductance of said limiting means in accordance with the said carrier-signal intensity, whereby said receiver may be accurately tuned to a desired carrier signal by observation of a characteristic of the signal translated by said limiting means.

2. A tuning indicator system for a tunable frequency-modulation carrier-signal receiver comprising: carrier-signal limiting means including an electron-discharge device having a plurality of electrodes one pair thereof being coupled in a circuit proportioned to develop a predetermined relatively fixed amplitude-limiting level, and another pair of said electrodes electron-coupled to said circuit, one of said other pair of said electrodes being so arranged as to develop in the vicinity of said one electrode a virtual cathode which in combination with said other pair of said electrodes is effective to control the transconductance of said device independent of limiting so that in the output circuit of said limiting means said limiting level appears to vary in value with said transconductance though said level actually remains relatively fixed; means for deriving at least at the point of said limiting means in said system a control effect varying with the average intensity of a carrier signal applied to said limiting means; and means responsive to said control effect for controlling the transconductance of said limiting means in accordance with said carrier-signal intensity, whereby said receiver may be accurately tuned to a desired carrier signal by observation of a characteristic of the signal translated by said limiting means.

3. A tuning indicator system for a tunable frequency-modulation carrier-signal receiver comprising: a carrier-signal vacuum-tube repeater stage including a plurality of electrodes, one pair thereof being coupled in a circuit proportioned to develop a predetermined relatively fixed amplitude-limiting level and another pair of said electrodes electron-coupled to said circuit, one of said other pair of said electrodes being so arranged as to develop in the vicinity of said one electrode a virtual cathode which is effective in combination with said other pair of said electrodes to control the transconductance of said stage so that in the output circuit of said repeater stage said limiting level appears to vary in value with said transconductance though said level actually remains relatively fixed; means for deriving at least at the point of said stage in said system a control effect varying with the average intensity of a carrier signal applied to said stage; and means responsive to said control effect for controlling the transconductance of said stage to vary the transconductance thereof in accordance with said carrier-signal intensity, whereby said receiver may be accurately tuned to a desired carrier signal by observation of a characteristic of the signal translated by said repeater stage.

4. A tuning indicator system for a tunable frequency-modulation carrier-signal receiver comprising: a carrier-signal limiter of the grid bias type including a plurality of electrodes, one pair thereof being coupled in a circuit proportioned to develop a predetermined relatively fixed amplitude-limiting level, and another pair of said electrodes electron-coupled to said circuit, one of said other pair of said electrodes being so arranged as to develop in the vicinity of said one electrode a virtual cathode which is effective in combination with said other pair of said electrodes to control the transconductance of said stage subsequent to limiting so that in the output circuit of said limiter said limiting level appears to vary in value with said transconductance though said level actually remains relatively fixed; said limiter being effective to derive at least at the point of the effective limiting therein a potential varying with the average intensity of a carrier signal applied to said limiter; and a control system for utilizing said potential so to control the transconductance of said limiter as to vary the transconductance thereof in accordance with said carrier-signal intensity, whereby said receiver may be accurately tuned to a desired carrier signal by observation of a characteristic of the signal translated by said limiter.

5. A tuning indicating system for a tunable frequency-modulation carrier-signal receiver comprising: a carrier-signal limiter of the grid-bias type including a repeater vacuum tube having an anode, a cathode and a plurality of electrodes intermediate said anode and said cathode, said cathode and one of said intermediate electrodes being coupled in a circuit proportioned to develop a predetermined relatively fixed amplitude-limiting level, said anode and another of said intermediate electrodes being electron coupled to said circuit including said cathode, and said other of said intermediate electrodes being so arranged as to develop near said other electrode a virtual cathode which is effective to control the transconductance of said tube subsequent to the limiting so that in the output circuit of said tube said limiting level appears to vary in value with said transconductance though said level actually remains relatively fixed; means for deriving at least at the position of said limiter in said system a control effect varying with the average intensity of a carrier signal applied to said limiter; and means for applying said control effect to said other of said intermediate electrodes to control the transconductance of said tube in accordance with said carrier-signal intensity, whereby said receiver may be accurately tuned to a desired carrier signal by observation of a characteristic of the signal translated by said limiter.

6. A tuning indicating system for a tunable frequency-modulation carrier-signal receiver comprising: a carrier-signal limiter of the grid-bias type including a repeater vacuum tube having at least an anode, a cathode, a control electrode and a suppressor electrode, said cathode and said control electrode being coupled in a circuit proportioned to develop a predetermined relatively fixed amplitude-limiting level, said anode and said suppressor electrode being electron coupled to said circuit including said cathode, and said suppressor electrode being so arranged as to develop in the vicinity thereof a virtual cathode which is effective to control the transconductance of said tube subsequent to the limiting so that in the output circuit of said tube said limiting level appears to vary in value with said transconductance though said level actually remains relatively fixed; means for deriving at least at the position of said limiter in said system a control effect varying with the average intensity of a carrier signal applied to said limiter; and means for applying said control effect to said suppressor electrode to control the transconductance of said tube in accordance with said carrier-signal intensity, whereby said receiver may be accurately tuned to a desired carrier signal by observation of a characteristic of the signal translated by said limiter.

7. A tuning indicating system for a tunable frequency-modulation carrier-signal receiver comprising: a carrier-signal limiter of the grid-bias type including a repeater vacuum tube having an anode, a cathode, a control electrode, a suppressor electrode and a screen electrode, said cathode, said control electrode and said screen electrode being coupled in a circuit proportioned to develop a predetermined relatively fixed amplitude-limiting level, said anode and said suppressor electrode being electron coupled to said circuit including said cathode, and said suppressor electrode being positioned between said screen electrode and said anode to develop near said suppressor electrode a virtual cathode which is effective to control the transconductance of said tube subsequent to the limiting so that in the output circuit of said tube said limiting level appears to vary in value with said transconductance though said level actually remains relatively fixed; means for deriving at least at the position of said limiter in said system a control effect varying with the average intensity of a carrier signal applied to said limiter; and means for applying said control effect to said suppressor electrode to control the transconductance of said tube in accordance with said carrier-signal intensity, whereby said receiver may be accurately tuned to a desired carrier signal by observation of a characteristic of the signal translated by said limiter.

BERNARD D. LOUGHLIN.

REFERENCES CITED

The following references are of record in the file of this patent:

UNITED STATES PATENTS

| Number | Name | Date |
|---|---|---|
| 2,305,842 | Case | Dec. 22, 1942 |
| 2,344,699 | Hunt | Mar. 21, 1944 |
| 2,455,450 | Thompson | Dec. 7, 1948 |
| 2,472,301 | Koch | June 7, 1949 |